(12) United States Patent
Wang et al.

(10) Patent No.: US 8,875,071 B2
(45) Date of Patent: Oct. 28, 2014

(54) DEPLOYMENT OF CUSTOM SHIFT ARRAY MACRO CELLS IN AUTOMATED APPLICATION SPECIFIC INTEGRATED CIRCUIT DESIGN FLOW

(71) Applicant: LSI Corporation, San Jose, CA (US)

(72) Inventors: Hai Wang, Shanghai (CN); Joseph Garofalo, San Jose, CA (US); Barry L. Bartholomew, San Jose, CA (US); Liu Ming Xu, Shanghai (CN); Han Jun Zhang, Shanghai (CN); You Xin Rao, Shanghai (CN); Qin Xie, Shanghai (CN)

(73) Assignee: LSI Corporation, San Jose, CA (US)

( * ) Notice: Subject to any disclaimer, the term of this patent is extended or adjusted under 35 U.S.C. 154(b) by 3 days.

(21) Appl. No.: 13/904,202

(22) Filed: May 29, 2013

(65) Prior Publication Data

US 2014/0270050 A1 Sep. 18, 2014

Related U.S. Application Data

(60) Provisional application No. 61/801,977, filed on Mar. 15, 2013.

(51) Int. Cl.
*G06F 9/45* (2006.01)
*G06F 9/455* (2006.01)
*G06F 17/50* (2006.01)
*G11C 27/04* (2006.01)

(52) U.S. Cl.
CPC ............ *G06F 17/5045* (2013.01); *G11C 27/04* (2013.01)
USPC .......................................... 716/103; 716/106

(58) Field of Classification Search
CPC ........................... G06F 17/5022; G06F 17/504
USPC .................................................. 716/103, 106
See application file for complete search history.

(56) References Cited

U.S. PATENT DOCUMENTS

| 6,067,650 | A * | 5/2000 | Beausang et al. ............. 714/726 |
| 6,405,355 | B1 * | 6/2002 | Duggirala et al. ............ 716/122 |
| 2004/0015803 | A1 * | 1/2004 | Huang et al. .................... 716/10 |
| 2008/0222592 | A1 * | 9/2008 | Satoi et al. ....................... 716/13 |
| 2012/0246604 | A1 * | 9/2012 | Wang et al. .................... 716/107 |
| 2014/0143623 | A1 * | 5/2014 | Touba et al. .................. 714/728 |

* cited by examiner

*Primary Examiner* — Suresh Memula

(57) ABSTRACT

An automated method is provided for designing an integrated circuit. A net list of an integrated circuit design is generated, wherein the net list includes a scan chain having a sequence of individual scan cells. A sequence of two or more individual scan cells of the scan chain is identified as a candidate for replacement by a custom shift array macro cell. The identified sequence of two or more individual scan cells is then replaced with a custom shift array macro cell that provides a functionally equivalent shift function as the replaced sequence of two or more individual scan cells. The custom shift array macro cell includes only two input pins and one output pin.

22 Claims, 8 Drawing Sheets

700

DEPLOYMENT OF CUSTOM SHIFT ARRAY MACRO CELLS IN AUTOMATED APPLICATION SPECIFIC INTEGRATED CIRCUIT DESIGN FLOW

CROSS-REFERENCE TO RELATED APPLICATION

This application claims priority to U.S. Provisional Patent Application Ser. No. 61/801,977, filed on Mar. 15, 2013, the disclosure of which is fully incorporated herein by reference.

FIELD OF THE INVENTION

The field generally relates to systems and methods for designing integrated circuits and, in particular, systems and methods for designing and deploying custom shift register array macro cells in application specific integrated circuit design flows.

BACKGROUND

In general, an application specific integrated circuit (ASIC) design process includes two main design phases, such as an RTL (register transfer level) design phase and a physical design phase. An RTL design phase is performed by converting a user specification of integrated circuit function into an RTL description, which specifies how each portion of the integrated circuit operates on each clock cycle. In the physical design phase, an integrated circuit design is generated using a corresponding RTL file and a library of standard component cells such as basic logic gates (AND gate, OR gates, NAND gates, NOR gates, etc.) and macro cells such as adders, multiplexers, flip-flops, memory, etc. More specifically, a physical design phase includes various phases such as logic synthesis, placement, clock-tree synthesis, and routing. The use of shift registers is very common in ASIC design. In general, a shift register comprises a cascade of flip-flops in which an output of each flip-flop is connected to a "data" input of a next flip-flop in the shift register chain. Shift registers are used for various purposes such as scan testing for Design For Testing (DFT) applications, and a myriad of other functional purposes as is known by those of ordinary skill in the art. However, a shift register can consume a large amount of chip area, waste a significant amount of power through leakage current, and requires complex routing that results in wiring congestion due to the large amount of pins of the individual flip-flop cells that must be connected to implement the shift register.

SUMMARY

An embodiment of the invention includes an automated method for designing an integrated circuit. A net list of an integrated circuit design is generated, wherein the net list includes a scan chain having a sequence of individual scan cells. A sequence of two or more individual scan cells of the scan chain is identified as a candidate for replacement by a custom shift array macro cell. The identified sequence of two or more individual scan cells is then replaced with a custom shift array macro cell that provides a functionally equivalent shift function as the replaced sequence of two or more individual scan cells. The custom shift array macro cell includes only two input pins and one output pin.

Other embodiments of the invention will become apparent.

WRITTEN DESCRIPTION

Figure 1:
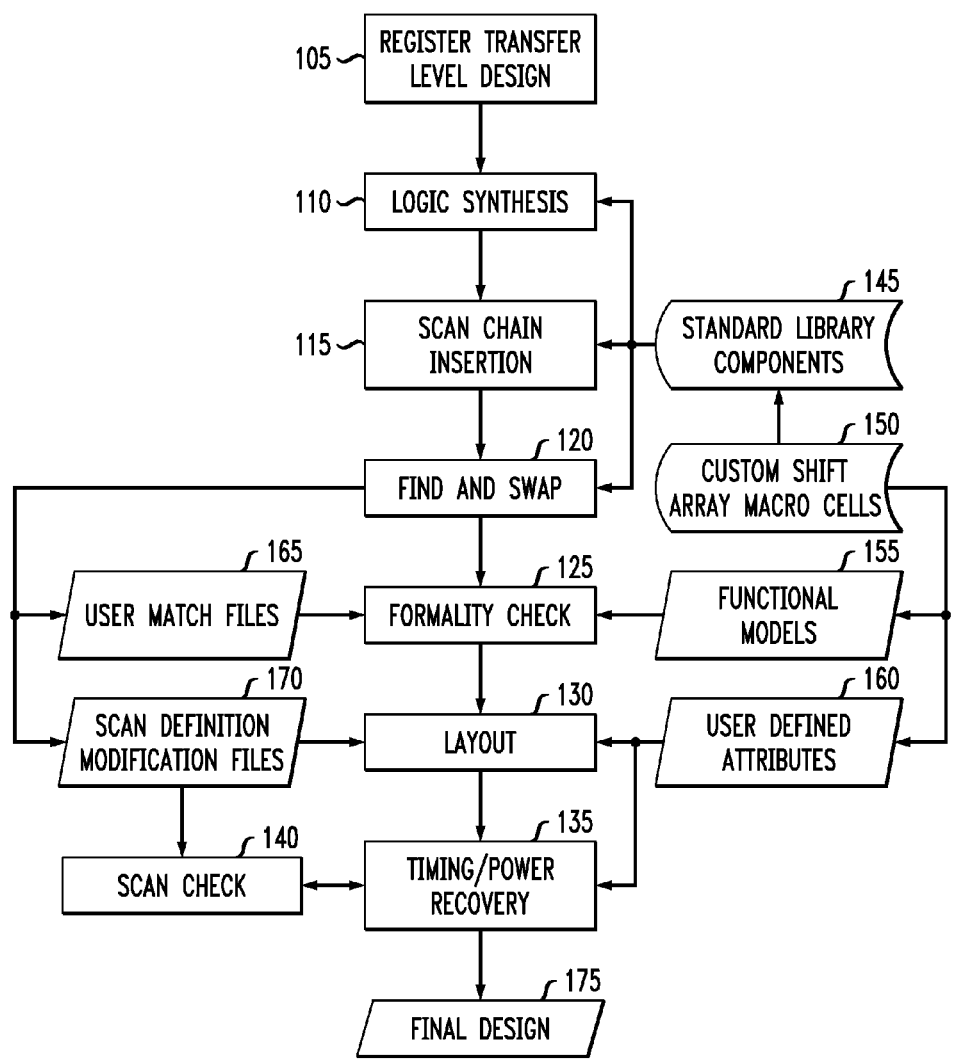
FIG. 1 illustrates a system for designing an integrated circuit using custom shift array macro cells, according to an embodiment of the invention.

FIG. 1 illustrates a system for designing an integrated circuit using custom shift array macro cells according to an embodiment of the invention. More specifically, FIG. 1 illustrates an ASIC design system 100 that is configured to implement an automated process flow for designing integrated circuits using custom shift array macro cells in place of standard shift register array logic cells, according to an embodiment of the invention. The ASIC design system 100 comprises a plurality of software design blocks (software tools) that are implemented at different stages of an ASIC process flow, including an RTL design block 105, a logic synthesis block 110, a scan chain insertion block 115, a find and swap block 120, a formality check block 125, a layout block 130, a timing and power recovery block 135, and a scan check block 140. The system 100 utilizes various data files and library components including a library of standard library components 145, a library of custom shift array macro cells 150, functional models 155 and user defined attribute files 160 associated with the custom shift array macro cells 150, and user match files 165 and scan definition modification files 170, which are generated as a result of a "find and swap" method implemented by the find and swap block 120. The ASIC design system 100 outputs a final design file 175. The various system components and data files shown in FIG. 1 will be explained in further detail below.

In general, the ASIC design system 100 of FIG. 1 implements a method as part of an ASIC design flow to replace a sequence of two or more individual scan cells of a shift register in a net list file with a custom shift array macro cell. In one embodiment of the invention, a method implemented by the ASIC design system of FIG. 1 for designing an integrated circuit comprises generating a net list of an integrated circuit design, wherein the net list comprises a scan chain comprising a sequence of individual scan cells, identifying a sequence of two or more individual scan cells in the scan chain which is a candidate for replacement by a custom shift array macro cell, and replacing the identified sequence of two or more individual scan cells with a custom shift array macro cell which provides a functionally equivalent shift function as the replaced sequence of two or more individual scan cells, wherein the custom shift array macro cell includes only two input pins and one output pin. By way of example, FIGS. 2A, 2B, and 2C schematically illustrate a process for replacing a portion of a shift register with a custom shift array macro cell according to an embodiment of the invention.

Figure 2A:
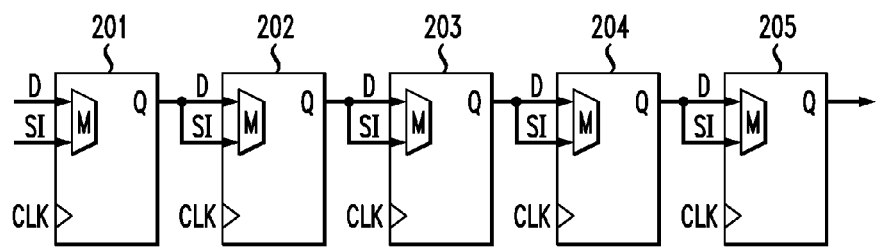
FIGS. 2A, 2B, and 2C schematically illustrate a process for replacing a sequence of two or more individual scan cells of a shift register with a custom shift array macro cell, according to an embodiment of the invention.

In particular, FIG. 2A illustrates a scan chain 200 (sequential logic circuit) comprising a series of individual scan cells 201, 202, 203, 204 and 205. Each individual scan cell 201, 202, 203, 204 and 205 comprises a data input port (D), a scan input port (SI), a data output port (Q), a clock input port (CLK), and a multiplexer M to select between the D input port or the SI input port. In one embodiment, the individual scan cells 201, 202, 203, 204 and 205 are multiplexer-type D flip-flops with well-known circuit architectures and functionality. The first scan cell 201 in the scan chain 200 is referred to herein as the "head" cell (or scan head cell), and the remaining scan cells 202, 203, 204, and 205 are referred to herein as "body" cells (or scan body cells). FIG. 2B illustrates a scan chain 210 formed by replacing the scan body cells 202, 203, 204 and 205 of FIG. 2A with non-scan body cells 211, 212, 213, and 214. In FIG. 2B, each of the non-scan body cells 211, 212, 213, and 214 comprises a data input port (D), a data output port (Q), and a clock input port (CLK). In one embodiment, the individual non-scan body cells 211, 212, 213, and 214 are D flip-flop cells with well-known circuit architectures and functionality.

Figure 2B:
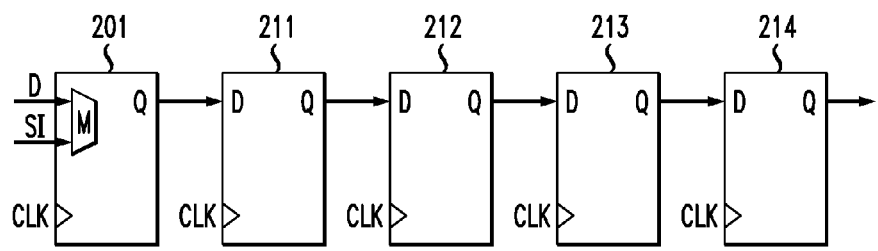
Figure 2C:
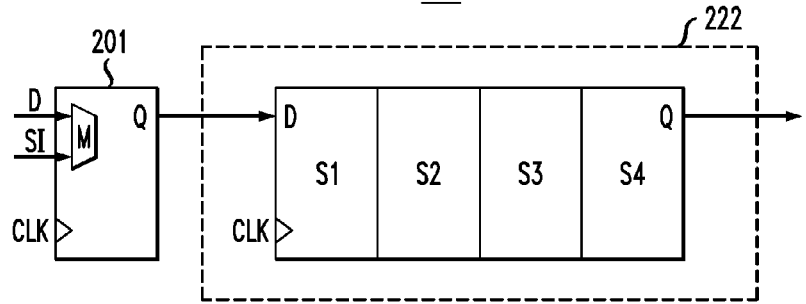

Furthermore, FIG. 2C illustrates a new sequential logic circuit 220 that is formed by replacing the four non-scan body cells 211, 212, 213 and 214 in FIG. 2B with a custom shift array macro cell 222 of shift-length 4 (i.e., 4 stages S1, S2, S3, and S4). The custom shift array macro cell 222 provides a functionally equivalent shift function as the replaced sequence of individual non-scan body cells 211, 212, 213 and 214. However, the custom shift array macro cell 222 includes only two input pins (D input and CLK input) and one output pin (Q output), whereas the four non-scan body cells 211, 212, 213 and 214 of FIG. 2B include a total of 8 input pins and 4 output pins. A process according to an embodiment of the invention for replacing a sequence of two or more individual scan cells of a scan chain with a custom shift array macro cell, such as depicted in FIGS. 2A, 2B, and 2C, will now be discussed in further detail with initial reference to FIG. 1.

Referring to FIG. 1, the RTL design block 105 is used during an initial phase of an integrated circuit design flow to convert a user specification of integrated circuit function of an integrated circuit into an RTL description that specifies how each portion of the integrated circuit operates on each clock cycle. A co-simulation process can be performed during the RTL design phase using a simulation program to compare a given RTL design with predefined circuit models to determine if the RTL design provides an expected functionality. The logic synthesis block 110 is used in a next phase of the integrated circuit design flow to generate a gate level representation (net list) of the integrated circuit design using various library components (or "component cells") such as macro cells (e.g., adders, multiplexers, banks of flip-flops, memory, etc.), logic gates (e.g., AND gates, OR gates, etc.), other logic circuits (e.g., flip-flops), etc., which are selected from the standard library components 145.

The standard library components 145 are included in one or more technology libraries that contain information that the logic synthesis block 110 uses to generate a net list for a given integrated circuit design based on the desired logical behavior and constraints on the given design. The logic synthesis block 110 utilizes information in a particular library to make appropriate decisions and component selections to build the integrated circuit design. As is known in the art, technology libraries include the logical function of a given component cell, as well as information such as the area of the cell, the input-to-output timing of the cell, constraints on the fan-out of the cell, timing checks that are required for the cell, etc.

The logic synthesis process block 110 is implemented using known logic synthesis techniques and tools that synthesize a net list from an RTL file (or other abstract form of desired circuit behavior) by selecting appropriate component cells from one or more target component cell libraries. The logic synthesis block 110 receives an RTL hardware description and a standard cell library as input and generates a gate-level net list as output. The resulting gate-level net list is a structural description with standard cells at the leaves of the design. During this process, the logic synthesis block 110 performs various steps such as high-level RTL optimizations, mapping of RTL to un-optimized Boolean logic, technology independent optimizations, and technology mapping to available standard cells.

Furthermore, the scan chain insertion block 115 performs a standard compiling process to configure those portions of the synthesized net list that relate to shift register scan chains, i.e., configure the various components (e.g., flip-flops or latches) in the net list to define scan chains. In general, a scan insertion process includes replacing components such as flip-flops and latches by scan cells, and logically connecting the scan cells to form scan chains. With state of the art logic synthesis and scan chain insertion tools, to implement a full-scan methodology, all flip-flops in a given design are automatically replaced, by default, with scan-type flip-flops (or scan flip-flops) that are able to select between two inputs—the data input (D) and a scan input (SI). When all flip-flops have been replaced with scan flip-flops, the scan flip-flops are connected to form shift registers, such as the scan chain 200 shown in FIG. 2A. The standard library components 145 include various types of optimized scan cells, such as the multiplexer-type D flip-flops 201, 202, 203, 204 and 205 as shown in FIG. 2A, as well as non-scan cells such as the non-scan D flip-flops 211, 212, 213, and 214, as shown in FIG. 2B.

The find and swap block 120 implements a method to find sequences of individual scan cells of scan chains in the integrated circuit design, which are candidates for replacement, and then replaces (swaps) a sequence of two or more individual scan cells of a shift register with a custom shift array macro cell of equivalent length and functionality. As noted above, FIGS. 2A, 2B, and 2C generally illustrate a process for replacing a sequence of two or more individual scan cells of a scan chain with a custom shift array macro cell of equivalent length and functionality, according to an embodiment of the invention. The scan chain 200 of FIG. 2A is generated as a result of execution of the scan chain insertion block 115. In one embodiment of the invention, an initial step that is performed as part of a "find and swap" process is to identify a scan chain "head" cell and scan chain "body" cells of a given scan chain, and then convert the scan chain body cells into non-scan type body cells. For example, the shift register 210 of FIG. 2B is generated by replacing the scan chain body cells 202, 203, 204 and 205 in FIG. 2A with non-scan body cells 211, 212, 213 and 214.

Thereafter, a find and swap process proceeds to replace two or more non-scan body cells with a functionally equivalent custom shift array macro cell that is maintained in the library of custom shift array macro cells 150. For example, the shift register 220 of FIG. 2C is generated by replacing the individual non-scan body cells 211, 212, 213 and 214 of FIG. 2B with a four-stage custom shift array macro cell 222, which provides the same functionality (shift-length of 4), but which provides reduced area, power consumption, and requires less routing resources. A find and swap process according to an embodiment of the invention will be discussed in further detail below with reference to FIG. 4, for example. While the example of FIG. 2C illustrates one embodiment of a custom shift array macro cell of shift-length 4 (i.e., four stages S1, S2, S3, and S4), which is included as part of the library of custom shift array macro cells 150 shown in FIG. 1, it is to be understood that in other embodiments of the invention, custom shift array macro cells of various lengths are included in the library of custom shift array macro cells 150.

Figure 3:
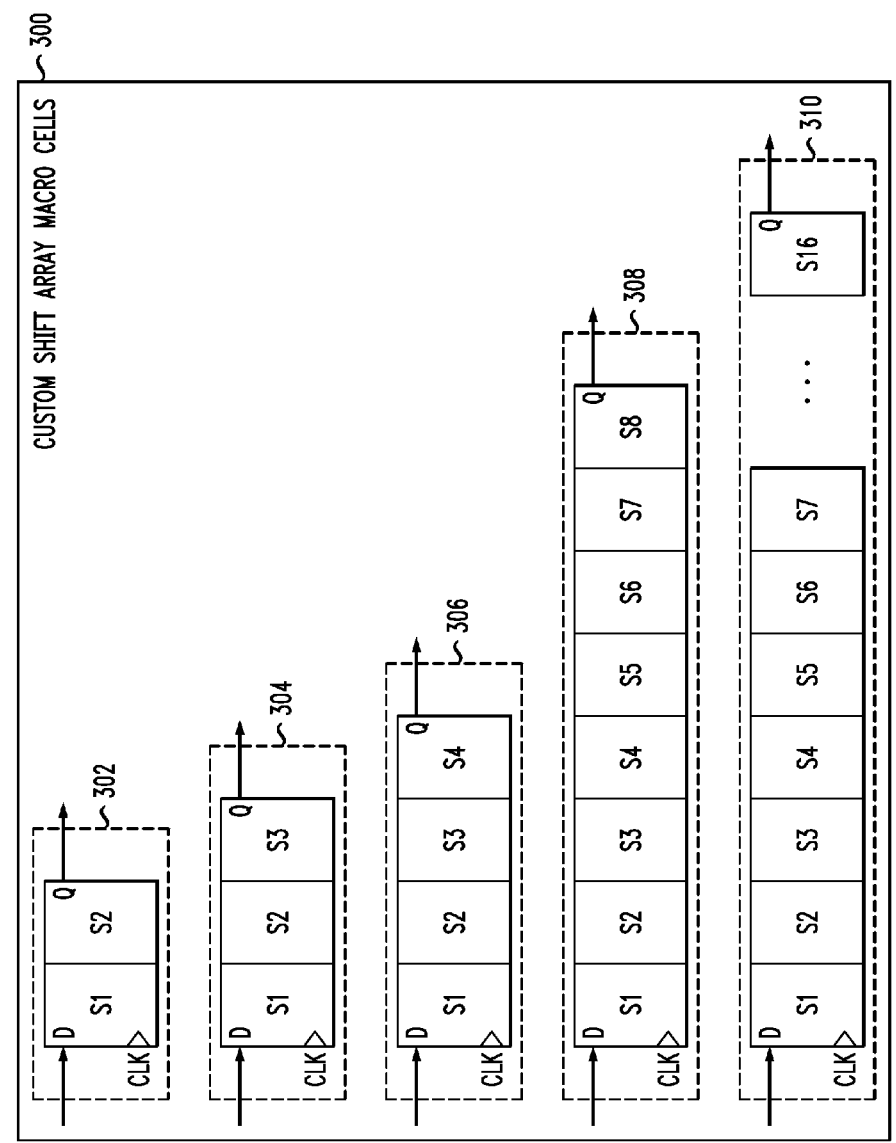
FIG. 3 shows a cell library comprising custom shift array macro cells, according to an embodiment of the invention.

For example, FIG. 3 shows a cell library 300 comprising a plurality of custom shift array macro cells of different shift-lengths, according to an embodiment of the invention. FIG. 3 shows a plurality of custom shift array macro cells of varying shift-lengths, including a custom shift array macro cell 302 of length 2, a custom shift array macro cell 304 of length 3, a custom shift array macro cell 306 of length 4, a custom shift array macro cell 308 of length 8, and a custom shift array macro cell 310 of length 16. The various custom shift array macro cells shown in FIG. 3 can be concatenated to create custom shift array macros of other desired lengths. For instance, the custom shift array macro cell 302 of length 2 and the custom shift array macro cell 304 of length 3 can be concatenated to implement a custom shift array of length 5.

As shown in FIG. 3, irrespective of length, each custom shift array macro cell 302, 304, 306, 308 and 310 is a three-pin macro having one input pin for a data input (D), one input pin for a clock input (CLK), and one output pin for data output (Q). In one embodiment of the invention, each stage (e.g., S1, S2, ...) of each custom shift array macro cell 302, 304, 306, 308 and 310 is functionally equivalent to an individual non-scan D flip-flop cell, such as shown in FIG. 2B. By way of specific example, in one embodiment of the invention, each custom shift array macro cell 302, 304, 306, 308, and 310 in FIG. 3 is multi-stage shift array circuit with each stage comprising a transmission gate-based D flip-flop circuit framework with master and slave latches. Except for the data input (D) to the first stage S1 and the data output (Q) of the last stage Si (e.g., i=2, 3, 4, 8, or 16) of each custom shift array macro cell 302, 304, 306, 308 and 310, the data inputs and outputs of the inner stages are internally connected within the given custom shift array macro cell 302, 304, 306, 308 and 310 to implement a shift array framework. Moreover, the single clock input CLK of a given custom shift array macro cell 302, 304, 306, 308 and 310 is commonly connected to each stage within the given custom shift array macro cell 302, 304, 306, 308 and 310. As compared to the functionally equivalent length of an array of individual body cells, the custom shift array macro cells are smaller in area and have less pins for connection to external components in the given integrated circuit design.

Moreover, referring back to FIG. 1, in one embodiment of the invention, the functional models 155 that are associated with the custom shift array macro cells 150 implement state table based syntax to describe the functional behavior of the custom shift array macro cells 150. For the individual shift array cells shown in FIGS. 2A and 2B, a flip-flop/latch-type library syntax is used to describe the functional behavior of the individual shift register cells. While conventional design compiler tools such as Synopsis-DC (Design Compiler) can understand a flip-flop/latch-type library syntax and can readily map these cell types into a net list during a logical synthesis process, the conventional design compiler tools cannot recognize state-table type library syntax descriptions which are used to describe the functional behavior of the custom shift array macro cells 150. Thus, conventional design compiler tools cannot treat the custom shift array macro cells 150 as "black boxes" and process them directly.

Instead, to implement custom shift array macro cells in a conventional ASIC design flow, we utilize the functionality of a conventional design compiler to identify shift registers cells having a "scan" option, such as the scan cells in the scan chain shown in FIG. 2A, and then set corresponding attributes on each of the individual cells separately. In particular, a conventional design compiler is used to identify head and body cells of a shift register and then convert the body cells from scan-type to non-scan type cells, for portions of the integrated circuit design wherein scan cells are not needed. Therefore, the scan body cells of a given scan chain can be swapped to non-scan body cells (without a multiplexer and scan input (SI) pin) to save area, such as shown in FIG. 2B, and then allow the non-scan body cells to be replaced with functionally equivalent custom shift array macro cells, such as shown in FIG. 2C.

Another alternative embodiment of the invention is to create manual instances of custom shift array macro cells in library files and in RTL, and have design compilers be able to directly process the custom shift array macro cells. However, this embodiment can be expensive in terms of production cost, time, and effort to implement manual instances of custom shift array macro cells in conventional tools used for the initial design stages. Moreover, chip designers would not be familiar with the new shift array macro cell designs, and the custom shift array macro cell designs would possibly reduce flexibility in the design of integrated circuits. Therefore, in one embodiment of the invention, a TCL script is utilized to extend a conventional design compiler tool to implement a "find and swap" process as discussed above, and as discussed in further detail below with reference to FIG. 4, to incorporate and utilize custom shift array macro cells in the logic synthesis, scan insertion, formal check, layout, power recovery, and timing closure stages of a standard automation ASIC flow.

Referring again to FIG. 1, following the find and swap process implemented by the find and swap block 120, a method is implemented by the formality check block 125 to check that there is functional equivalency between a given custom shift array macro cell and the sequence of body cells replaced by the given custom shift array macro cell. The find and swap block 120 generates user match files 165 which specify those portions of the original net list that were changed due to replacement of scan cells with custom shift array macro cells. The user match files 165 also describes the functionality of the portion of the net list that were replaced with custom shift array macro cells, and specifies various checkpoints of the individual body cells (e.g., outputs of each individual cell) that were replaced. Moreover, the formality check block 125 receives as input the functional models 155 that correspond to the custom shift array macro cells that were added to the net list as a result of the find and swap process of block 120. The functional models 155 define checkpoints at various points within corresponding custom shift array macro cells (e.g., outputs of each stage). The formality check block 125 utilizes the functional models 155 and the user match files 165 to compare the functionality of the custom shift array macro cells against the original functionality of the replaced scan cell sequences to confirm that there is functional equivalency. A formality check process according to an embodiment of the invention will be discussed in further detail below with reference to FIG. 9.

Following the formality check process implemented by the formality check block 125, a method is implemented by the layout block 130 to perform a floor planning (or placement) process wherein the various library components in the net list are assigned to non-overlapping locations on an integrated circuit die area. Furthermore, one or more signal distribution networks are constructed to connect to inputs of component logic cells in the integrated circuit design. In this process, a signal distribution network, such as a clock distribution network or a data signal distribution network, is constructed and added in the integrated circuit design. After the signal distribution network synthesis block is complete, a next step in the design involves performing a routing process to place component cells in the integrated circuit design and add wiring to the integrated circuit design. A routing process adds the wires that are needed to properly connect the placed component cells while obeying all design rules for the integrated circuit design. Techniques for placement, clock synthesis, and routing are well known to those of ordinary skill in the art.

As part of the layout design process, in one embodiment of the invention, the layout block 130 receives as input user defined attribute files 160 and scan definition modification files 170. The user defined attribute files 160 include user defined attributes associated with the custom shift array macro cells, which enable the layout and routing methods implemented by the layout block 130 to understand the functionality and other characteristics of the custom shift array macro cells included in the modified net list. The scan definition modification files 170 are modified versions of standard scan definition ("scandef") files, which are generated by the find and swap block 120 as a result of replacing sequences of body cells in scan chains with custom shift array macro cells. A standard scan definition file enables a conventional placement tool to recognize scan cell connections and reorder scan cells during placement, as necessary, to connect the scan cells and generate scan chains. Before scan cells are replaced with custom shift array macro cells, the scan cells resulting from the scan chain insertion process are marked with a floating attribute that enables scan cells in the original net list to be reordered, as necessary, to connect the scan cells and generate scan chains. However, in an embodiment of the invention, when a sequence of scan cells is replaced with a custom shift array macro cell, the ordering of the scan cells and custom shift array macro cells are fixed, and cannot be reordered. As such, the original scan definition file is modified to change the attributes to mark the scan cells and associated custom shift array macro cells as "fixed" and not re-orderable. A process for generating scan definition modification files will be discussed in further detail below with reference to FIGS. 7 and 8.

Following the layout process implemented by the layout block 130, a method is implemented by the timing and power recovery block 135 to determine if timing and power constraints for the integrated circuit design are satisfied. The static timing analysis may be performed using known static timing analysis tools such as PEARL. During a static timing analysis, a tool, such as PEARL, uses certain data files such as parasitics data, timing libraries, net list files, technology files, etc., to perform a static timing analysis. In accordance with an embodiment of the invention, the timing and power recovery block 135 receives as input the user defined attribute files 160. The user defined attribute files 160 include attributes that define power, cell delay and timing characteristics for custom shift array macro cells. While the functional models 155 define functional behavior of the custom shift array macro cells, the user defined attributes define the power, cell delay, voltage threshold, timing characteristics, and other relevant characteristics that are useful for power and timing recovery optimization of the integrated circuit design and, in particular, the integrated circuit design comprising the custom shift array macro cells. An example of a user defined attributes file will be further discussed below.

The scan check block 140 is implemented to ensure that the modified scan chains defined by the scan definition modification files 170 are properly working. The scan check block 140 confirms proper scan operation with results of timing and power recovery analysis generated by the timing and power recovery block 135. As noted above, the user match files 165 provide a report as to which sequences of body cells are replaced with custom shift array macro cells, as well as the name of the custom shift array macro cells. In one embodiment, a PERL script is implemented based on the user match files 165 to modify an original scan definition file to make sure that the scan chain information is correct. Once the design is complete and has met all constraints, the final design file 175 is generated and output (e.g., a GDS (generic data structures) library file). The final design file 175 is the file that is used by a foundry to fabricate an ASIC defined by the final design file 175.

Figure 4:
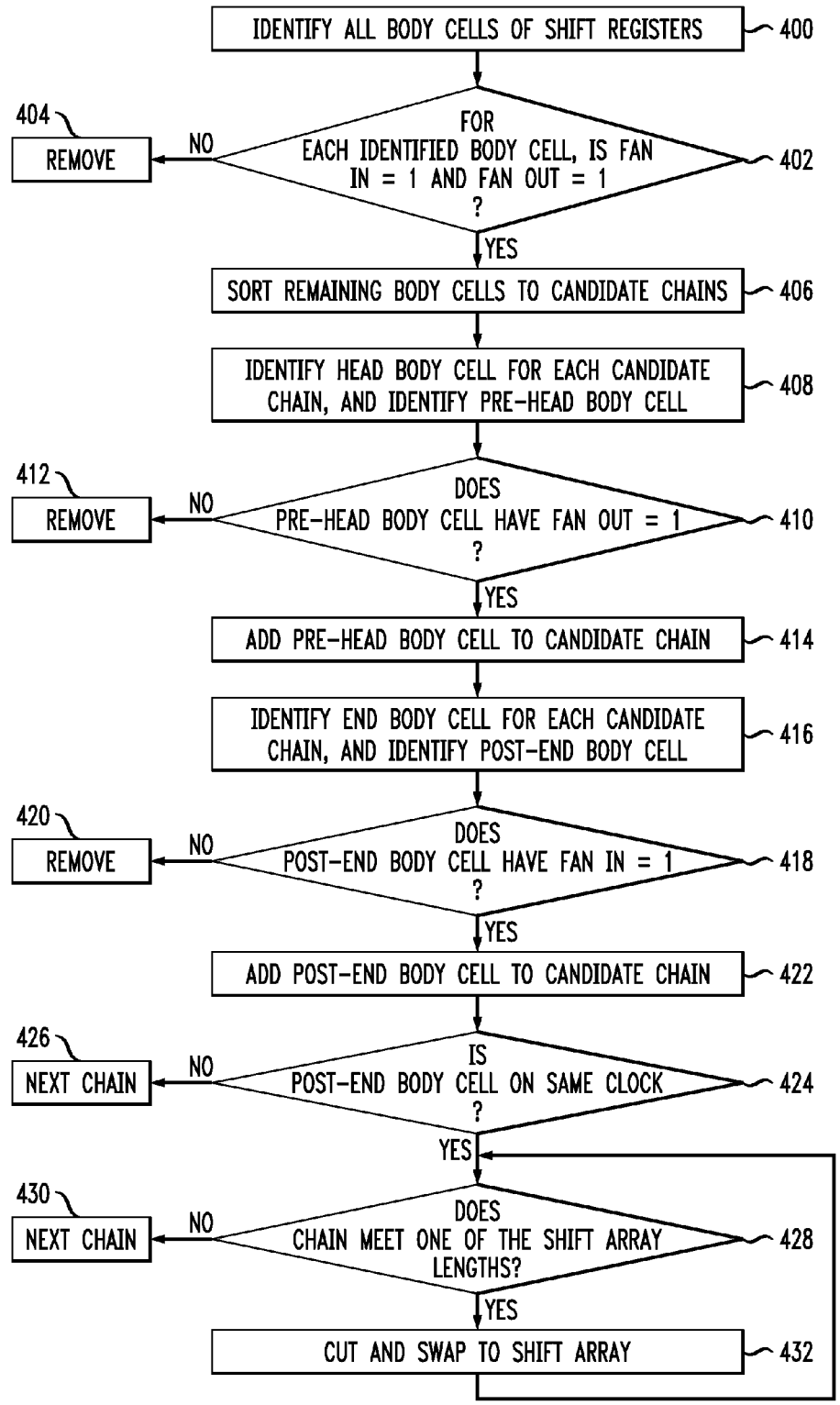
FIG. 4 is a flow diagram of a process for replacing a sequence of two or more individual scan cells of a shift register with a custom shift array macro cell, according to an embodiment of the invention.

FIG. 4 is a flow diagram that illustrates a process for replacing a sequence of two or more individual scan cells of a shift register with a custom shift array macro cell, according to an embodiment of the invention. In one embodiment of the invention, the method of FIG. 4 is implemented by the find and swap block 120 of FIG. 1. For purposes of illustration, the method of FIG. 4 will be discussed with reference to the example integrated circuits shown in FIGS. 5 and 6, for example. Referring to FIG. 4, an initial step includes processing the shift register circuits in the integrated circuit design to identify all body cells of the shift registers (block 400). For each identified body cell, a determination is made as to whether the body cell has a fan-in and fan-out equal to 1 (block 402). If a given body cell has either a fan-in or fan-out that is not equal to 1, the given body cell is temporarily removed from consideration as a candidate cell (block 404).

Figure 5:
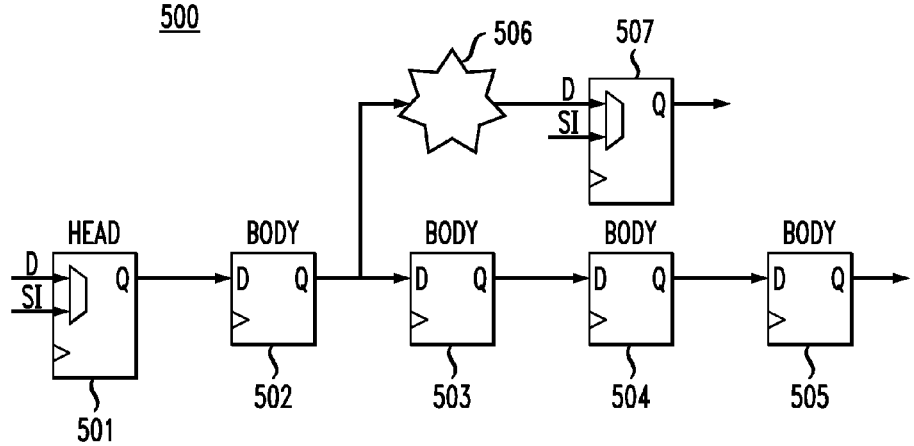
FIG. 5 shows a portion of an integrated circuit design having a shift register to which the process flow of FIG. 4 can be applied.

In general, this initial process (blocks 400 and 402) is implemented to find candidate body cells having a 1 to 1 connection, which can be grouped into sequences of body cells that are replaced with functionally equivalent custom shift array macro cells. For example, FIG. 5 shows a portion of an integrated circuit design having a shift register to which the process flow of FIG. 4 can be applied. In particular, FIG. 5 shows an integrated circuit 500 comprising a shift register comprising a head cell 501 and four body cells 502, 503, 504, and 505. An output of a first body cell 502 is connected to an input of a combinatorial circuit 506. An output of the combinatorial circuit 506 is connected to a data input (D) of a head scan cell 507 of another shift register. As shown in FIG. 5, each body cell 503, 504 and 505 has a fan-in and fan-out equal to 1, while the body cell 502 has a fan-in of 1, but a fan-out of 2. As such, the body cell 502 is initially removed from consideration (via block 404). In the example of FIG. 5, while the body cells 502, 503, 504 and 505 provide a sequence of 4 cells, this sequence of 4 body cells cannot be replaced by a custom shift array macro cell with a shift-length of 4 (e.g., the shift array macro cell 306, FIG. 3) because the fan-out and fan-in of all the body cells 502, 503, 504, and 505 are not equal to 1, and the custom shift array macro cells do not include internal pins that are connectable to external components. This is to be contrasted with the examples of FIGS. 2B and 2C, wherein the sequence of four body cells 211, 212, 213, and 214 can be replaced with the custom shift array macro cell 222 with a shift-length of 4, as the fan-in and fan-out of all the body cells 211, 212, 213 and 214 are equal to 1.

Figure 6:
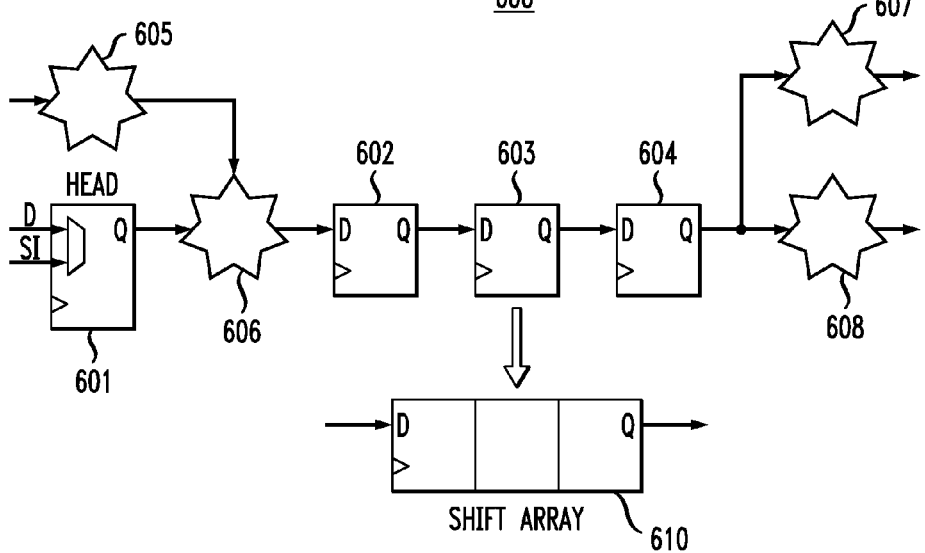
FIG. 6 shows a portion of an integrated circuit design having a shift register to which the process flow of FIG. 4 can be applied.

In another example, FIG. 6 shows a portion of an integrated circuit design having a shift register to which the process flow of FIG. 4 can be applied. In particular, FIG. 6 shows an integrated circuit 600 comprising a shift register comprising a head cell 601 and three body cells 602, 603, and 604. The integrated circuit 600 further includes a plurality of combinatorial circuits 605, 606, 607, and 608. An output of the head cell 601 is connected to an input of the combinatorial circuit 606. An output of the combinatorial circuit 605 is connected to an input of the combinatorial circuit 606. An output of the combinatorial circuit 606 is connected to an input of the body cell 602. An output of the body cell 604 is connected to inputs of both combinatorial circuits 607 and 608. As shown in FIG. 6, the body cell 603 has a fan-in and fan-out equal to 1, while the body cell 602 has a fan-in of 2 and a fan-out of 1, and the body cell 604 has a fan-in of 1 and a fan-out of 2. As such, the body cells 602 and 604 are initially removed from consideration (via block 404).

Next, referring back to FIG. 4, for all remaining body cells with a fan-in and fan-out equal to 1, the body cells are sorted and grouped into candidate chains (block 406). For each candidate chain, the head body cell for that candidate chain is identified, and then the body cell before the head body cell ("pre-head body cell") in the candidate chain is identified (block 408). For each identified pre-head body cell in each candidate chain, a determination is made as to whether the pre-head body cell has a fan-out of 1 (block 410). If the pre-head body cell does not have a fan-out of 1, the pre-head body cell is removed from consideration as being part of the candidate chain (block 412). On the other hand, if the pre-head body cell has a fan-out of 1, then the pre-head body cell is added to the candidate chain (block 414).

By way of example, in the integrated circuit 500 of FIG. 5, the body cells 503, 504 and 505 would be grouped into a candidate chain (via block 406), and the body cell 503 would be identified as the head body cell for the candidate chain (via block 408). Moreover, the body cell 502 would be identified as the pre-head body cell of the candidate chain with a fan-out of 2 (via block 410). As such, the body cell 502 would be removed from consideration as being part of the candidate chain (via block 412).

Moreover, in the example of FIG. 6, the body cell 603 would be grouped into a candidate chain (via block 406), and the body cell 603 would be identified as the head body cell for the candidate chain (via block 408). Moreover, the body cell 602 would be identified as the pre-head body cell of the candidate chain with a fan-out of 1 (via block 410). As such, the body cell 602 would be added to the candidate chain (via block 414).

Next, referring again to FIG. 4, for each candidate chain, an end body cell for that candidate chain is identified, and then the body cell following the end body cell ("post-end body cell") in the candidate chain is identified (block 416). For each identified post-end body cell in each candidate chain, a determination is made as to whether the post-end body cell has a fan-in of 1 (block 418). If the post-end body cell does not have a fan-in of 1, the post-end body cell is removed from consideration as being part of the candidate chain (block 420). On the other hand, if the post-end body cell has a fan-in of 1, then the post-end body cell is added to the candidate chain (block 422).

By way of example, in the integrated circuit 500 of FIG. 5, the body cell 505 would be identified as the end body cell for the candidate chain (via block 416). Moreover, assuming that the body cell 505 is the last body cell in the chain, it would be determined that there is no post-end body cell for the candidate chain. Thus, no post-end body cell could be added to the candidate chain (via blocks 418 and 422). Moreover, in the example of FIG. 6, the body cell 603 would be identified as the end body cell for the candidate chain (via block 416). Moreover, the body cell 604 would be identified as the post-end body cell of the candidate chain with a fan-in of 1 (via block 418). As such, the body cell 604 would be added to the candidate chain (via block 422).

Referring again to FIG. 4, a determination is made as to whether the added post-end body cell is on a same clock signal as the other body cells in the candidate chain (block 424). If the added post-end body cell is not on a same clock signal as the other body cells in the candidate chain (negative determination in block 424), the post-end body cell is considered as part of a next chain (block 426). If the added post-end body cell is on a same clock signal as the other body cells in the candidate chain (affirmative determination in block 424), then a determination is made as to whether the resulting candidate chain has a length that can be replaced with a functionally equivalent shift array macro cell of a same length (block 428). If the resulting candidate chain has a length that does not meet a length of a functionally equivalent shift array macro cell in the library of custom shift array macro cells (negative determination in block 428), the post-end body cell is added to the next chain for consideration (block 430).

On the other hand, if the resulting candidate chain has a length that does meet a length of a functionally equivalent shift array macro cell in the library of custom shift array macro cells (affirmative determination in block 428), then the candidate chain is replaced with a functionally equivalent shift array macro cell having a shift-length equal to a number of body cells of the candidate chain (block 432). By way of example, as shown in FIG. 6, by adding the pre-head body cell 602 and post-end body cell 604 to the original candidate chain which only included body cell 603, then the resulting chain of body cells 602, 603 and 604 has a number of cells (i.e., 3) that is equal to a functionally equivalent custom shift array macro cell 610 having a shift-length of 3, as shown in FIG. 6. As such, the sequence of individual body cells 602, 603, and 604 can be replaced with the custom shift array macro cell 610 shown in FIG. 6. This process (blocks 428, 430 and 432) is repeated until all the body cells of the given candidate chain are replaced by one or more concatenated custom shift array macro cells.

Figure 7:
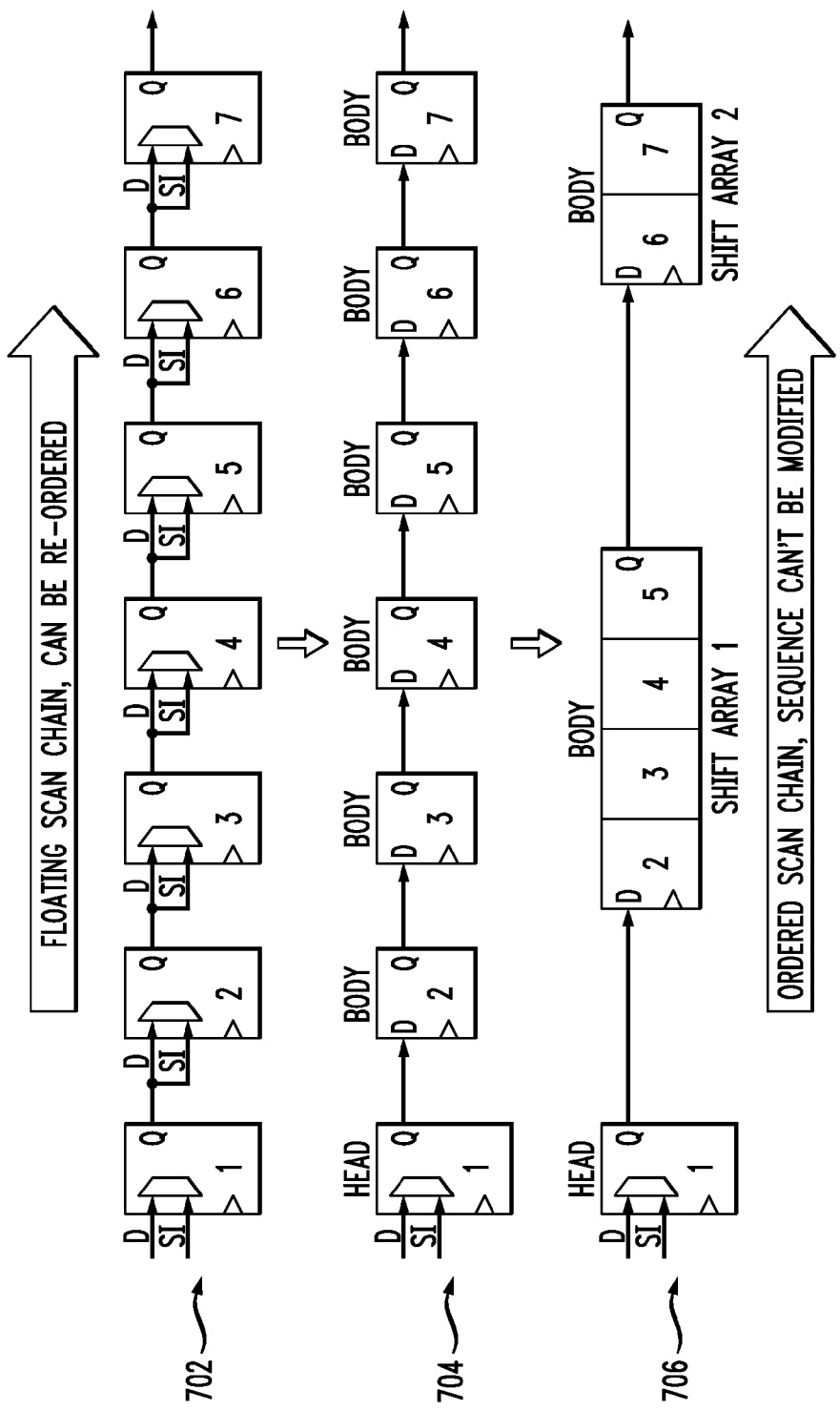
FIG. 7 schematically illustrates a process for ordering sequences of scan cells of a shift register, according to an embodiment of the invention.

FIG. 7 schematically illustrates a process for ordering a sequence of scan cells of a shift register, according to an embodiment of the invention. In one embodiment of the invention, FIG. 7 schematically illustrates a process 700 that is implemented in the scan chain insertion block 115 and the find and swap block 120 of FIG. 1. In the example of FIG. 7, a seven (7)-stage scan chain 702 is shown which is generated as a result of a scan chain insertion process executed by the scan chain insertion block 115 of FIG. 1. Each scan cell (1, 2, 3, 4, 5, 6, 7) in the original scan chain 702 is defined with a floating attribute that enables the scan cells (1, 2, 3, 4, 5, 6, 7) to be re-ordered by a later stage tool, such as an IC complier tool when performing a placement process. However, after the scan body cells (2, 3, 4, 5, 6, 7) in the original scan chain 702 are identified and changed to non-scan body cells (2, 3, 4, 5, 6, 7) in a newly defined shift register 704, the floating attribute of each cell (1, 2, 3, 4, 5, 6, 7) in the new shift register 704 changes to an order attribute to indicate that the sequence of the cells (1, 2, 3, 4, 5, 6, 7) in the new shift register 704 cannot be changed (the cells (1, 2, 3, 4, 5, 6, 7) cannot be re-ordered).

Furthermore, FIG. 7 shows a new shift register 706 that is generated after replacing the first four (2, 3, 4, 5) sequential body cells in shift register 704 with a first custom shift array macro cell (shift array 1) and the last two (6, 7) sequential body cells in shift register 704 with a second custom shift array macro cell (shift array 2), to generate the shift register 706 with two concatenated custom shift array macro cells of shift-length 4 and shift-length 2, respectively. Referring to the example flow diagram of FIG. 4, even though the six body cells (2, 3, 4, 5, 6, 7) of the modified chain 704 of FIG. 7 are included in an original candidate chain (via blocks 402 and 406 of FIG. 4), the last two body cells (6, 7) are sequentially removed to a next candidate chain (via iteration of blocks 428 and 430 of FIG. 4), so that two available custom shift array macro cells of shift-lengths 4 and 2 can be used and concatenated to replace the sequence of six body cells (2, 3, 4, 5, 6, 7) of the modified chain 704 of FIG. 7.

Figure 8:
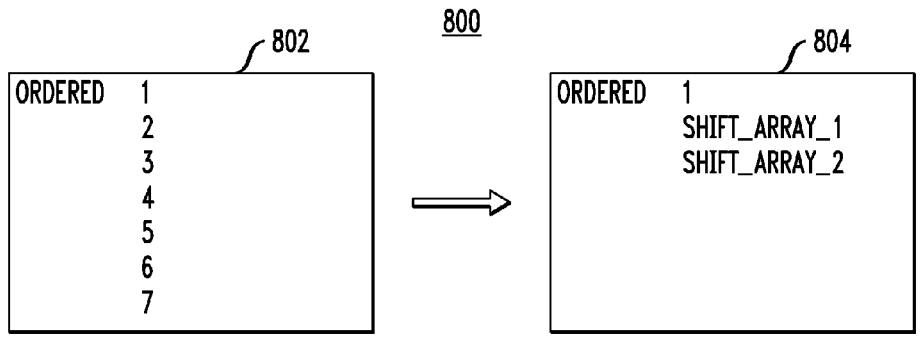
FIG. 8 schematically illustrates a process for modifying an original scan definition file to generate a new scan definition file in which individual body cells of a shift register are replaced with custom shift array macro cells, according to an embodiment of the invention.

FIG. 8 schematically illustrates a process for modifying an original scan definition file to generate a new scan definition file in which individual body cells of a shift register are replaced with shift array macro cells, according to an embodiment of the invention. In one embodiment of the invention, FIG. 8 illustrates a process 800 that is implemented by the find and swap block 120 of FIG. 1 to modify an original scan definition file 802 and generate a modified scan definition file 804 based on the example shown in FIG. 7. In particular, FIG. 8 illustrates the original scan definition file 802 that specifies an order of the individual cells (1, 2, 3, 4, 5, 6, 7) of the shift register 704 of FIG. 7. Moreover, FIG. 8 illustrates the modified scan definition file 804 that is generated based on the original ordering of the individual cells to reflect a corresponding order of the head cell (1) and the first and second custom shift array macro cells (shift_array__1, shift_array__2) corresponding to the ordered body cells (2, 3, 4, 5) and (6, 7), respectively. In one embodiment of the invention, as noted above, a PERL script is developed to implement a scan definition file modification process, based on an original scan definition file generated by the scan chain insertion block 115 and a report file that is generated by the find and swap block 120.

Figure 9:
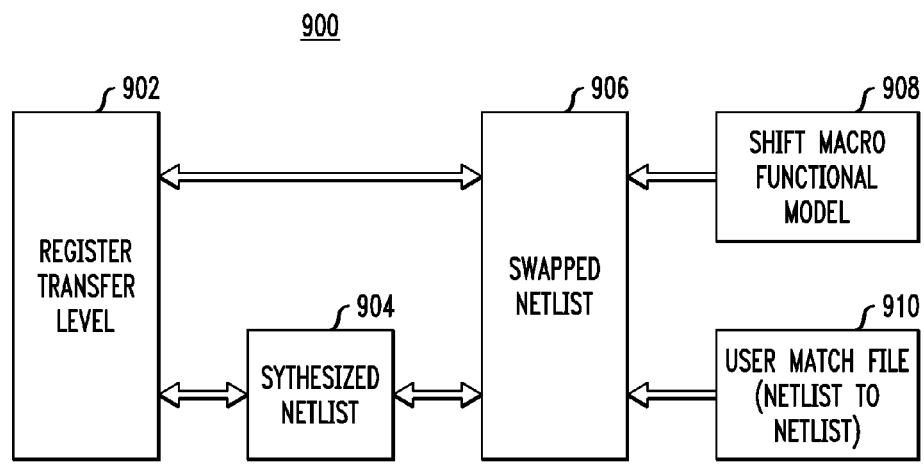
FIG. 9 schematically illustrates a process for performing a formality check according to an embodiment of the invention.

FIG. 9 schematically illustrates a process for performing a formality check according to an embodiment of the invention. In one embodiment of the invention, FIG. 9 illustrates a process that is implemented by the formality check block 125 of FIG. 1. As noted above, a formality check is performed to ensure that the circuit behavior is the same pre and post replacement of individual scan cells with custom shift array macro cells. As shown in FIG. 9, a formality check is performed between a register transfer level file 902 and an original synthesized net list 904. Furthermore, a formality check is performed between the original synthesized net list 904 (pre-swap) and a swapped (modified) net list 906 which is generated after replacing individual scan cells with custom shift array macro cells. This formality check process ensures that the original synthesized net list 904 and the swapped net list 906 have the same function.

Moreover, as noted above, during the formality check between the synthesized net list 904 and the swapped net list 906, functional models 908 of the shift array macro cells are used to determine circuit behavior and the user match files 910 are used to match each checkpoint defined for the original shift register with corresponding checkpoints defined for the shift array macro cells that are used to modify the original shift register, and compare the corresponding check points to confirm functional equivalency. Moreover, a formality check is performed between the RTL 902 and the swapped net list 906 to conform functional equivalency between the shift registers defined in the RTL and the corresponding modified shift registers with custom shift array macro cells as defined in the swapped net list 906. The formality check between the RTL 902 and the swapped net list 906 is performed using the shift array macro functional models 908 and possibly the user match files 910.

As discussed above, in one embodiment of the invention, the custom shift array macro cells use a state table syntax to describe functional behavior. This format cannot be understood by conventional tools such as the Synopsis DC tool, the Synopsis IC Compiler tool (for placement) and the Synopsis PT (Prime Time) tool (for static timing analysis). These conventional tools will treat the custom shift array macro cells with state table syntax as black boxes and not allow a designer to execute ECOs (engineering change orders) on the custom shift array macro cells. As a result, custom shift array macro cells with a same functionality (same shift-length) could not be replaced with other shift array macro cells having the same function, but different characteristics such as different voltage thresholds (Vt), delay and/or power characteristics for purposes of optimizing power and timing recovery.

Accordingly, in one embodiment of the invention, as noted above, different user defined attributes can be associated with functionally equivalent custom shift array macro cells such that a set_user_attribute is used to set a user_function_class on a same class of custom shift array macro cells, as shown below, to allow the conventional tools to determine that custom shift array macro cells with different defined characteristics are functionally equivalent.

| | |
|---|---|
| set_user_attribute [get_lib_cells */TG_SHFT2DFPQ* ] | user_function_class shift_2_dfpq |
| set_user_attribute [get_lib_cells */TG_SHFT4DFPQ* ] | user_function_class shift_4_dfpq |
| set_user_attribute [get_lib_cells */TG_SHFT8DFPQ* ] | user_function_class shift_8_dfpq |
| set_user_attribute [get_lib_cells */TG_SHFT16DFPQ*] | user_function_class shift_16_dfpq |

Figure 10:
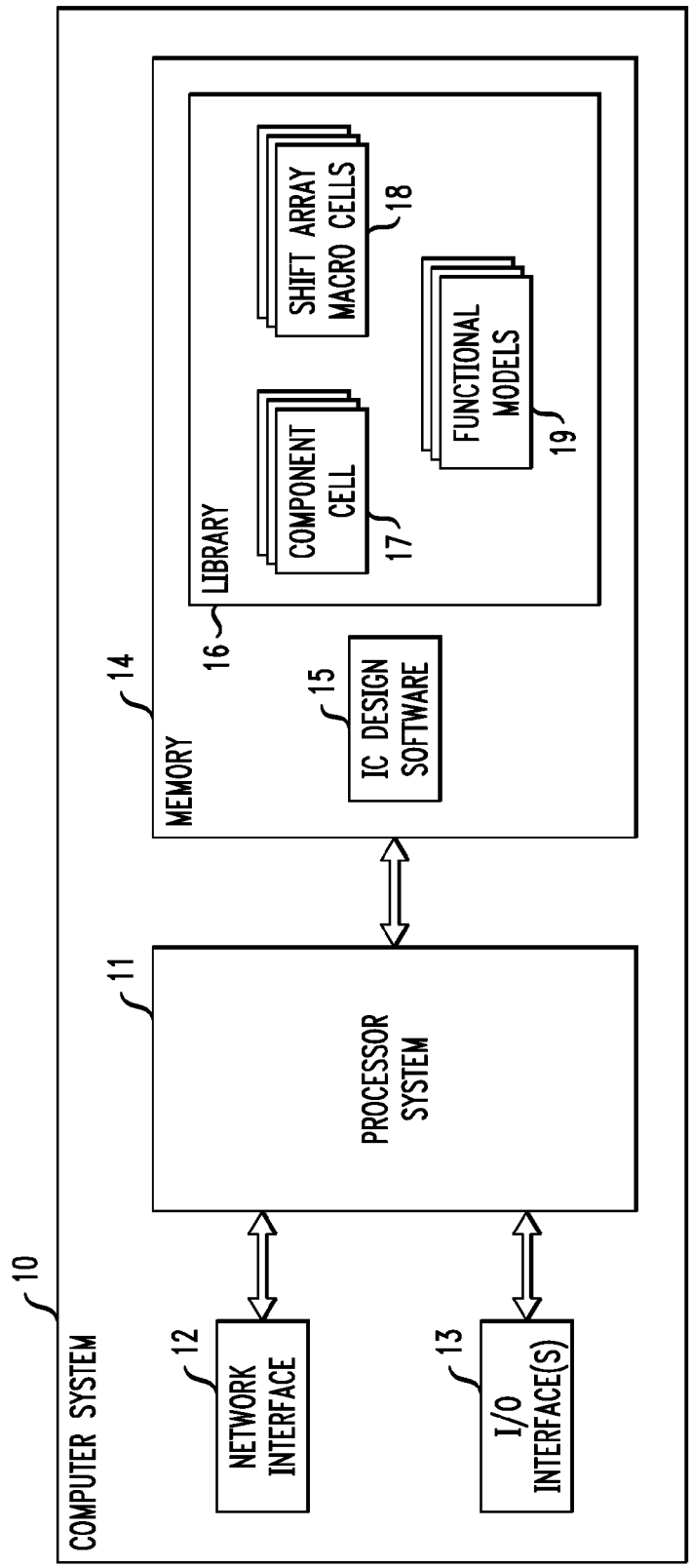
FIG. 10 is a high-level block diagram of a computing system for designing an integrated circuit chip according to an embodiment of the invention.

It is to be understood that in some embodiments, the various integrated circuit design steps described herein, such as those steps shown and discussed above with reference to FIGS. 1-9 may be embodied in program code (software programs) which is executable by a computing system to implement the various integrated circuit design steps. For instance, FIG. 10 is a high-level block diagram of a computing system 10 for designing an integrated circuit chip according to an embodiment of the invention. In general, the computing system 10 comprises a processor system 11, a network interface 12, one or more input/output (I/O) interfaces 13, and a memory system 14 which stores, for example, integrated circuit design software 15 and a component cell library 16 comprising various component cells 17 (such as macro cells), custom shift array macro cells 18, and functional models 19 of the custom shift array macro cells 18.

The network interface 12 is coupled to the processor system 11 to provide an interface that allows the processor system 11 to communicate with other systems and devices over one or more networks. The network interface 12 may comprise one or more transceivers. The I/O interface(s) 13 is/are coupled to the processor system 11 to provide an interface that allows the processor system 11 to communicate with one or more external devices such as a keyboard, a pointing device, a display, etc. The processor system 11 is coupled to the memory 14 to execute program instructions (e.g., integrated circuit design software 15) and access associated data (e.g., library components 17, 18, 19) for designing an integrated circuit using techniques as discussed herein.

For instance, the integrated circuit design software 15 may include one or more software programs for implementing an RTL design phase to convert a user specification of chip function into an RTL description, and various phase of a physical design phase including, but not limited to, logic synthesis, placement, signal distribution network synthesis, routing, timing analysis and auditing, using the various components 17, 18 and 19 of the cell library 16 stored in memory 14. The memory 14 is an example of what is more generally referred to herein as a computer readable storage medium or other type of computer program product having computer program code tangibly embodied thereon. The memory 14 may comprise, for example, electronic memory such as RAM or ROM, magnetic memory, optical memory, or other types of storage devices in any combination. The processor system 11 may comprise a microprocessor, CPU, ASIC, FPGA or other type of processing device, as well as portions or combinations of such devices.

Furthermore, embodiments of the invention may be implemented in the form of integrated circuits such as shown in FIGS. 2C, 3, 5 and 6, for example. In an integrated circuit implementation, identical dies are typically formed in a repeated pattern on a surface of a semiconductor wafer. Each die includes one or more circuit cores and circuitry as described herein, and may include other structures or circuits. The individual die are cut or diced from the wafer, and then each die is packaged as an integrated circuit. One skilled in the art would know how to dice wafers and package die to produce integrated circuits. Integrated circuits so manufactured are considered embodiments of this invention.

Although embodiments of the invention have been described herein with reference to the accompanying drawings, it is to be understood that embodiments of the invention are not limited to the described embodiments, and that various changes and modifications may be made by one skilled in the art resulting in other embodiments of the invention within the scope of the following claims.

What is claimed is:

1. An automated method of designing an integrated circuit, comprising:
generating a net list of an integrated circuit design, wherein the net list comprises a scan chain comprising a sequence of individual scan cells;
identifying a sequence of two or more individual scan cells in the scan chain which is a candidate for replacement by a custom shift array macro cell; and
replacing the identified sequence of two or more individual scan cells with a custom shift array macro cell that provides a functionally equivalent shift function as the replaced sequence of two or more individual scan cells, wherein the custom shift array macro cell includes only two input pins and one output pin,
wherein generating, identifying, and replacing are performed using a computer.

2. The method of claim 1, wherein the custom shift array macro cell comprises multiple flip-flop stages, and wherein the custom shift array macro cell comprises a single data input pin, a single data output pin, and a single clock input pin.

3. The method of claim 2, wherein each flip-flop stage comprises a D flip-flop circuit architecture.

4. The method of claim 1, wherein identifying a sequence of two or more individual scan cells in the scan chain which is a candidate for replacement by a custom shift array macro cell, comprises:
identifying a head cell and scan body cells of a scan chain;
converting the scan body cells to non-scan body cells; and
grouping the non-scan body cells into one or more groups of ordered non-scan body cells.

5. The method of claim 4, wherein grouping the non-scan body cells into one or more groups of ordered non-scan body cells is performed with constraints that a head body cell at a beginning of a group has fan-out of 1, that an ending body cell at an end of the group has a fan-in of 1, and that each non-scan body cell in the group between the head and ending body cells has a fan-in of 1 and a fan-out of 1.

6. The method of claim 4, wherein replacing the identified sequence of two or more individual scan cells with a custom shift array macro cell comprises replacing a given group of ordered non-scan body cells with a custom shift array macro cell having a shift-length equal to a number of non-scan cells in the given group.

7. The method of claim 1, wherein replacing the identified sequence of two or more individual scan cells with a custom shift array macro cell comprises:
accessing a library of custom shift array macro cells, wherein the library of custom shift array macro cells comprises a plurality of custom shift array macro cells of various shift-lengths, including shift-lengths of 2, 3, 4, 8 and 16; and
replacing a sequence of two or more individual scan cells with a custom shift array macro cell having a shift-length that is equal to a number individual scan cells in the sequence of two or more individual scan cells to be replaced.

8. The method of claim 1, further comprising performing a formality check to verify a functional equivalence between the sequence of two or more individual scan cells and the custom shift array macro cell that replaces the sequence of two or more individual scan cells.

9. The method of claim 8, wherein performing a formality check comprises:
receiving a functional model of the custom shift array macro cell, wherein the functional model comprises a state table syntax to describe a function of the custom shift array macro cell and specified checkpoints at various points within the custom shift array macro cell for checking functionality;
receiving a user match file that is generated as part of the replacing step, wherein the user match file specifies a portion of an original net list that was changed due to replacement of the sequence of two or more individual scan cells with the custom shift array macro cell, wherein the user match file describes a functionality of the portion of the original net list that was changed, and wherein the user match file specifies various checkpoints of the sequence of two or more individual scan cells that were replaced; and
using the functional model and the user match file to compare a functionality of the custom shift array macro cell against the original functionality of the replaced sequence of two or more individual scan cells to confirm that there is functional equivalency.

10. A computer readable storage medium comprising a program of instructions which, when executed by a computer, perform method steps for designing an integrated circuit, the method steps comprising:

generating a net list of an integrated circuit design, wherein the net list comprises a scan chain comprising a sequence of individual scan cells;

identifying a sequence of two or more individual scan cells in the scan chain which is a candidate for replacement by a custom shift array macro cell; and replacing the identified sequence of two or more individual scan cells with a custom shift array macro cell that provides a functionally equivalent shift function as the replaced sequence of two or more individual scan cells, wherein the custom shift array macro cell includes only two input pins and one output pin.

11. A computing system, comprising:

a memory to store program instructions for designing an integrated circuit; and a processor system coupled to the memory, wherein the processor system is operative to execute the stored program instructions to perform a method for designing an integrated circuit, the method comprising:

generating a net list of an integrated circuit design, wherein the net list comprises a scan chain comprising a sequence of individual scan cells;

identifying a sequence of two or more individual scan cells in the scan chain which is a candidate for replacement by a custom shift array macro cell; and replacing the identified sequence of two or more individual scan cells with a custom shift array macro cell that provides a functionally equivalent shift function as the replaced sequence of two or more individual scan cells, wherein the custom shift array macro cell includes only two input pins and one output pin.

12. The computing system of claim 11, wherein the custom shift array macro cell comprises multiple flip-flop stages, and wherein the custom shift array macro cell comprises a single data input pin, a single data output pin, and a single clock input pin.

13. The computing system of claim 12, wherein each flip-flop stage comprises a D flip-flop circuit architecture.

14. The computing system of claim 11, wherein identifying a sequence of two or more individual scan cells in the scan chain which is a candidate for replacement by a custom shift array macro cell, comprises:

identifying a head cell and scan body cells of a scan chain;
converting the scan body cells to non-scan body cells; and
grouping the non-scan body cells into one or more groups of ordered non-scan body cells.

15. The computing system of claim 14, wherein grouping the non-scan body cells into one or more groups of ordered non-scan body cells is performed with constraints that a head body cell at a beginning of a group has fan-out of 1, that an ending body cell at an end of the group has a fan-in of 1, and that each non-scan body cell in the group between the head and ending body cells has a fan-in of 1 and a fan-out of 1.

16. The computing system of claim 14, wherein replacing the identified sequence of two or more individual scan cells with a custom shift array macro cell comprises replacing a given group of ordered non-scan body cells with a custom shift array macro cell having a shift-length equal to a number of non-scan cells in the given group.

17. The computing system of claim 11, wherein replacing the identified sequence of two or more individual scan cells with a custom shift array macro cell comprises:

accessing a library of custom shift array macro cells stored in the memory, wherein the library of custom shift array macro cells comprises a plurality of custom shift array macro cells of various shift-lengths, including shift-lengths of 2, 3, 4, 8 and 16; and replacing a sequence of two or more individual scan cells with a custom shift array macro cell having a shift-length that is equal to a number individual scan cells in the sequence of two or more individual scan cells to be replaced.

18. The computing system of claim 11, wherein the processor system is further operative to execute the stored program instructions for performing a formality check to verify a functional equivalence between the sequence of two or more individual scan cells and the custom shift array macro cell that replaces the sequence of two or more individual scan cells.

19. The computing system of claim 18, wherein performing a formality check comprises:

receiving a functional model of the custom shift array macro cell, wherein the functional model comprises a state table syntax to describe a function of the custom shift array macro cell and specified checkpoints at various points within the custom shift array macro cell for checking functionality;

receiving a user match file that is generated as part of the replacing step, wherein the user match file specifies a portion of an original net list that was changed due to replacement of the sequence of two or more individual scan cells with the custom shift array macro cell, wherein the user match file describes a functionality of the portion of the original net list that was changed, and wherein the user match file specifies various checkpoints of the sequence of two or more individual scan cells that were replaced; and using the functional model and the user match file to compare a functionality of the custom shift array macro cell against the original functionality of the replaced sequence of two or more individual scan cells to confirm that there is functional equivalency.

20. An integrated circuit, comprising:

a plurality of shift registers, wherein at least one shift register comprises:

a scan head cell and a shift array macro cell connected to the scan head cell, wherein the shift array macro cell provides a shift function equivalent to a sequence of n individual shift register cells, and wherein the shift array macro cell includes only two input ports and one output port.

21. The integrated circuit of claim 20, wherein n is equal to 2, 3, 4, 8 or 16.

22. The integrated circuit of claim 20, wherein shift array macro cell comprises multiple flip-flop stages, and wherein the shift array macro cell comprises a single data input pin, a single data output pin, and a single clock input pin.

* * * * *